United States Patent [19]

O'Donnell, Jr. et al.

[11] 4,313,218
[45] Jan. 26, 1982

[54] EXTENDED AGC FOR A RADIO RECEIVER

[75] Inventors: John J. O'Donnell, Jr., Arlington Heights; Kenneth S. Hutchinson, Schaumburg, both of Ill.

[73] Assignee: Motorola, Inc., Schaumburg, Ill.

[21] Appl. No.: 176,310

[22] Filed: Aug. 8, 1980

[51] Int. Cl.³ .............................................. H04B 00/00
[52] U.S. Cl. ................................... 455/239; 455/250; 455/253
[58] Field of Search ............... 455/217, 234, 239, 247, 455/249, 250, 251, 253, 287

[56] References Cited

U.S. PATENT DOCUMENTS

| | | | |
|---|---|---|---|
| 2,895,045 | 7/1959 | Kagan | 455/249 |
| 2,945,121 | 7/1960 | Bradmiller | 455/250 |
| 2,981,835 | 4/1961 | Webster et al. | 455/250 |
| 3,490,046 | 1/1970 | Russell | 455/287 |
| 3,571,715 | 3/1971 | Beary | 455/217 |
| 3,622,887 | 11/1971 | Byles | 455/250 |
| 4,158,814 | 6/1979 | Imazeki et al. | 455/217 |

OTHER PUBLICATIONS

Motorola, Inc., "1980 Ford Remote CB Radio System Service Manual 80-2," (1979), 1-4, 16.

Primary Examiner—Marc E. Bookbinder
Attorney, Agent, or Firm—James W. Gillman; James S. Pristelski

[57] ABSTRACT

An extended AGC circuit renders at least one of a pair of back-to-back diodes, which together form antenna switch, continuously conductive under high RF input signal conditions to the radio receiver to extend the AGC performance of the receiver over a greater range of RF input signal conditions. A local/distant switch function can be easily and economically added to the extended circuit.

4 Claims, 1 Drawing Figure

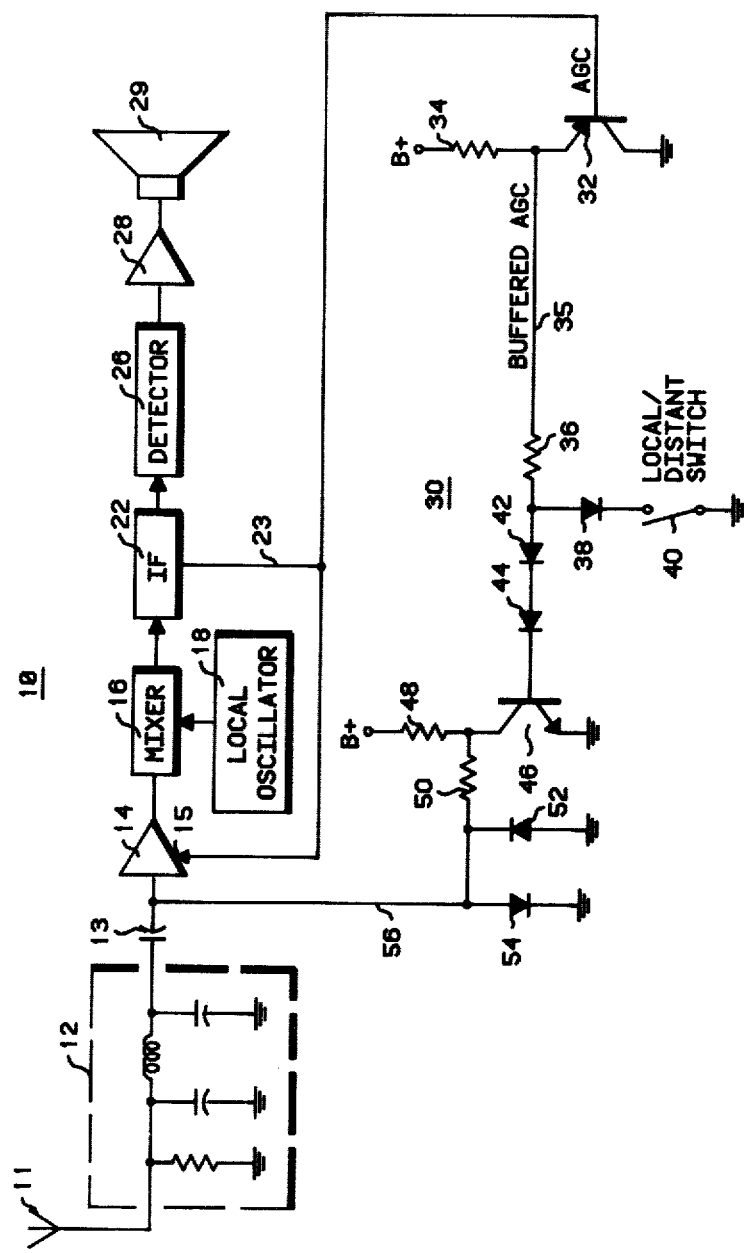

EXTENDED AGC FOR A RADIO RECEIVER

BACKGROUND OF THE INVENTION

This invention is concerned in general with an automatic gain control (AGC) circuit for a radio receiver and, more particularly, with an extended AGC circuit which biases one of a pair of back-to-back diodes, normally used to clip high RF input signals to the radio receiver, into a continuously conductive mode to extend the AGC performance of the radio receiver under high level RF input signals, and further with biasing of the back-to-back diodes to obtain local/distant switch operation in the radio receiver.

Use of back-to-back diodes to clip the RF input signal to a radio receiver is known to the prior art. Generally, such back-to-back diodes are disposed at some point in the radio receiver between the antenna input and the first RF amplifier stage. Typical silicon back-to-back diodes operate to clip the amplitude of the input RF signal to about ±0.7 volts. Basically, the diodes limit the signal by being rendered conductive during that portion of the RF signal which exceeds ±0.7 volts by shunting the peaks of the RF signal to a DC reference, usually ground potential. Under such operating conditions, the back-to-back diodes are not conductive during those portions of the RF signal which do not exceed ±0.7 volts. Of course, if the peaks of the RF signal significantly exceed ±0.7 volts, the back-to-back diodes may not be able to limit the peak-to-peak magnitude of the RF signal to ±0.7 volts, but instead will limit the RF signal at some higher peak-to-peak magnitude. Back-to-back diodes are often used in transceivers as peak signal limiting devices to prevent any transmitted signal from entering the receiver portion of the transceiver with excessive magnitude.

It is also known to the prior art to use an automatic gain control (AGC) circuit in the radio receiver to control the gain of various portions of the radio receiver in response to the strength of the RF input signal. Generally, the AGC signal is generated in the intermediate frequency (IF) portion of the radio receiver as a DC level which is related in magnitude to the magnitude of the IF signal, which is in turn related to the magnitude of the RF signal. This DC level of the AGC signal is then usually applied to the RF amplifier portion of the radio receiver to control the gain of the RF amplifier. This enables the radio receiver to be responsive to a wide range of RF input signals without generating a correspondingly wide range of detected and recovered audio signals. That is, due to AGC, the magnitude of the audio signals will generally be relatively constant, or at least not vary over correspondingly broad ranges, in comparison with the broad range of RF signals which may be applied through the antenna to the radio receiver. A widely known shortcoming of such AGC circuits is that the AGC circuits are not responsive to a sufficiently broad range of input signal levels to accommodate all of the possible RF input signal magnitudes, especially at high RF input signal conditions.

It has also been known to the prior art to use local/distant switches to give the operator of the radio receiver more control over the performance of the radio receiver under high RF input signal conditions. This is because the local/distant switch, when in the local mode, typically inserts some attenuation between the antenna and the input to the RF amplifier stage of the radio receiver such that high RF input signals are significantly attenuated. The radio receiver is then capable of handling the attenuated RF signals. In the distant mode of the local/distant switch, little if any attenuation is inserted into the antenna lead to the RF amplifier stage and the radio receiver therefore operates in its usual manner of handling the RF input signals directly from the antenna. Performance of the radio receiver in receiving weak distant signals is thus not degraded.

The back-to-back diode circuit, the AGC circuit and the local/distant switch function of the radio receiver have heretofore typically been separate circuits which have not been functionally interrelated or interactive.

SUMMARY OF THE INVENTION

Accordingly, it is a principal object of the present invention to use at least one of the diodes of the back-to-back diode pair which are ordinarily used to clip the peaks of high RF input level signals to extend the AGC performance of the radio receiver over that normally obtainable by an AGC circuit alone.

A related object of the present invention is to provide biasing circuitry for at least one of the diodes of the back-to-back diode pair as a means of obtaining a simplified and economical local/distant switch function for the radio receiver.

A further object of the present invention is to provide both extended AGC and local/distant switch functions for the radio receiver by means of a single biasing circuit for at least one of the diodes of the back-to-back diode pair.

Another object of the present invention is to provide circuitry for the back-to-back diode antenna switch circuit, the extended AGC circuit, and the local/distant switch circuit which may be easily implemented as part of an integrated circuit for additional economy.

A general object of the present invention is to provide improved high RF signal handling capabilities and antenna switching in low cost, low power transceivers.

The extended AGC circuit of the present invention is responsive to the DC level provided by an automatic gain control signal from the radio receiver. The automatic gain control signal is related in magnitude to the magnitude of the RF signals to which the radio receiver is tuned. The circuit includes at least one semiconductive device connected to the means for coupling the RF signals from the antenna to the radio receiver. The semiconductive device is preferably in the form of back-to-back diodes which are oppositely poled such that the diodes limit the magnitude of the RF signals which exceed about ±0.7 volts. The extended AGC circuit further includes a buffer circuit portion and a biasing circuit portion. The buffer circuit portion buffers the AGC line of the receiver so as not to load or otherwise disturb the AGC performance of the receiver. The buffered AGC portion of the circuit controls the biasing portion of the circuit such that when the AGC line reaches a predetermined DC level, the biasing circuit provides at least one of the back-to-back diodes with bias current to render it continuously conductive. The conductive state of the diode shunts at least a portion of the RF signals away from the radio receiver under high RF signal level conditions, which effectively extends the AGC range of the radio receiver by providing attenuation of the RF signals. Also connected to the biasing circuit portion of the extended AGC circuit is a local/distant switch which, when in the local mode, also controls the biasing portion of the circuit to cause a bias current to be supplied to at least one of the back-to-back diodes to render it continuously conductive and thereby shunt at least a portion of the RF signals away from the radio receiver. Thus, both the extended AGC and local/distant functions are obtained from a back-to-back diode antenna switch. Further, the extended AGC circuit may be easily implemented as part of an integrated circuit.

BRIEF DESCRIPTION OF THE DRAWING

The single drawing FIGURE is partially in block form illustrating a conventional radio receiver and partially in schematic diagram form for illustrating the extended AGC circuit of the present invention.

DESCRIPTION OF THE PREFERRED EMBODIMENT

Referring to the single drawing FIGURE, there is shown a radio receiver, generally designated 10 which may be a part of a radio transceiver such as that used in the citizens radio frequency band. An antenna 11 couples to a filter 12, the internal components of which are selected in a well known manner to create a filter characteristic for passing signals within the desired RF frequency band. The output of filter 12 is coupled by a capacitor 13 to an RF amplifier stage 14. RF amplifier stage 14 is conventionally tuned to a selected channel or station for receiving the information transmitted thereon. The output of RF amplifier 14 feeds to one input of a mixer 16. Acting in a known manner, the mixer 16 translates the signal from RF amplifier 14 by an oscillator frequency generated by a local oscillator 18. This results in the information channel being recentered at an intermediate frequency (IF). The output from mixer 16 feeds to an IF stage 22. The IF stage 22 provides filtering at the IF frequency to reject unwanted signals and amplifies the filtered signal. Intermediate frequency stages are well known in the radio arts. Following the IF stage 22 is a detector stage 26 which extracts the audio information from the intermediate frequency signal. Detector 26 feeds to an audio amplifier 28 which amplifies the detected audio signal and drives a speaker 29. The detector 26, audio frequency amplifier 28 and speaker 29 are also well known in the radio receiver arts.

The IF stage 22 also generates an automatic gain control (AGC) signal on an output line 23. The AGC signal on line 23 is typically a DC level which is related in magnitude to the strength of the IF signal within IF stage 22. The strength of the IF signal is in turn related to the strength of the RF signal in RF amplifier 14. The AGC signal on line 23 is applied to the RF amplifier at input terminal 15 of RF amplifier 14. This AGC signal to RF amplifier 14 causes the RF amplifier to change its gain in response to the magnitude of the AGC signal in a manner well known to the prior art. Such AGC arrangements are widely used in the radio arts since this enables the radio receiver 10 to receive a wide range of RF input signals from antenna 11 while minimizing the range of audio signal received from speaker 29. In the embodiment shown in the drawing FIGURE, the AGC signal on line 23 is inversely related to the magnitude of RF input signals to RF amplifier 14 such that a high RF signal input will result in a low DC level on AGC line 23.

In accordance with one aspect of the present invention, there is provided a circuit for biasing at least one of a pair of back-to-back diodes 52, 54 such that one of the diodes 54 is rendered continuously conductive to shunt at least a portion of the RF signal therethrough. The extended AGC circuit 30 includes an emitter-follower stage including a PNP transistor 32 and a resistor 34. The base of transistor 32 is connected directly to AGC line 23 and the emitter of transistor 32 is connected through resistor 34 to the supply voltage B+. The collector terminal of transistor 32 is connected to ground. This portion of the circuit 30 provides a buffered AGC signal at line 35 which is also connected to the emitter of transistor 32. Transistor 32 thereby buffers AGC line 23 from any loading or other disturbance which could affect and might otherwise require redesign of the AGC circuit portion of radio receiver 10.

The biasing circuit portion of extended AGC circuit 30 includes resistor 36, diodes 42 and 44, transistor 46, and resistors 48 and 50. Resistor 36 connects buffered AGC line 35 to the anode of a diode 42 which in turn has its cathode connected to the anode of another diode 44, which in turn has its cathode connected to the base of transistor 46. Transistor 46 is of the NPN type and has its emitter connected to ground and its collector connected through a resistor 48 to supply voltage B+. The collector of transistor 46 is also connected through a resistor 50 to the pair of back-to-back diodes 52 and 54.

It is understood in this context that the meaning of back-to-back diodes is that the diodes 52 and 54 are oppositely poled such that one of the diodes 54 has its anode connected to resistor 50 while the other diode 52 has its cathode connected thereto. Resistor 50, the anode of diode 54 and the cathode of diode 52 are also connected by means of a line 56 to the input of RF amplifier 14. Thus, the RF input signal levels to RF amplifier 14 are also presented directly to diodes 52 and 54 by way of line 56. Diodes 52 and 54 operate in the well known antenna switch configuration in which the peaks of the RF input signal which exceed the forward bias potential of diodes 52 and 54, which for silicon diodes is typically about 0.7 volts, are shunted to ground. It should be noted however that diodes 52 and 54 are not continuously conductive, but only conduct during that portion of the RF signal which exceeds the respective ±0.7 volt level. At other times, diodes 52 and 54 are nonconductive and therefore present little if any loss to the input to RF amplifier 14.

A local/distant switch function is simply and economically implemented by a diode 38 in series connection with a switch 40. The anode of diode 38 is connected to the anode of diode 42 and to resistor 36. Its cathode is connected through switch 40 to ground.

Operation of the extended AGC circuit is as follows. Under high RF signal level input conditions to RF amplifier 14, as previously discussed above, AGC line 23 will be at a low DC level. This tends to cause the emitter to collector voltage on transistor 32 to collapse to at or near the saturation mode of transistor 32. This in turn lowers the voltage level at the buffered AGC line 35 to a low DC level about one forward biased emitter to base junction of transistor 32 above that of the AGC line 23. Since it requires two forward biased diode 42, 44 potentials and one forward biased base-to-emitter transistor 46 junction, or about 2.1 volts for silicon semiconductive devices, to maintain transistor 46 in a conductive condition, transistor 46 will now be rendered nonconductive. Thus, transistor 46 is cutoff and its collector voltage rises to the voltage determined by the resistor voltage divider formed by resistors 48 and 50. Transistor 46 therefore no longer conducts the current supplied by resistor 48 from the B+ voltage supply to ground, but instead permits current to flow through resistors 48 and 50 from the voltage supply B+ to forwardly bias diode 54 into a continuously conductive condition. This continuously conductive condition of diode 54 greatly lowers the impedance level seen at the input of RF amplifier 14 and the diode 54 therefore shunts a significant portion of the RF input signal to RF amplifier 14 to ground. That is, at high RF input signal levels, the extended AGC circuit 30 provides switching in of attenuation by rendering diode 54 continuously conductive. This extends the range of AGC performance otherwise obtainable by only applying the AGC signal on line 23 to RF amplifier 14 at its AGC input 15.

On the other hand, if the RF input signal level to RF amplifier 14 is at a low RF level, the DC level on AGC line 23 will be at a relatively high DC level. Correspondingly, the DC level of buffered AGC line 35 will be at a correspondingly high DC level of about one forward biased emitter base potential above that of AGC line 23. This high DC level on buffered AGC line 35 now forward biases diodes 42 and 44 and transistor 46 to render transistor 46 conductive. Resistor 36 limits the current drawn by the forward biased diodes and transistor. When transistor 46 is conductive, it is driven into saturation and sinks current from the voltage supply B+ through resistor 48 such that no bias current is supplied by resistor 48 or 50 to the back-to-back diodes 52 and 54. In this mode of operation, resistor 50 serves to isolate transistor 46 from the diodes 52 and 54 such that the back-to-back diodes can limit any sudden high RF input signals or noise impulses. It will be readily understood by those skilled in the radio arts that AGC circuits typically have a relatively slow response time on the order of about 1 msec such that the AGC level cannot instantaneously respond to changes in the RF input signal conditions. It is therefore desirable to have the back-to-back diodes 52 and 54 isolated from transistor 46. It is further desirable to have resistor 50 be of a significantly high value such that the conductive state of transistor 46 does not present any significant load to the input RF signals at the input of RF amplifier 14.

In accordance with another aspect of the present invention, the back-to-back diodes also provide a relatively simple and efficient local/distant switch function. When local/distant switch 40 is in the open position shown in the drawing FIGURE, the switch is then in the distant mode and the operation of extended AGC circuit is as hereinabove described. That is, extended AGC is not affected. However, when local/distant switch 40 is closed and in the local mode, any biasing current for transistor 46 through resistor 36 is shunted by diode 38 through the closed switch 40 to ground. Since there is then only one forward biased diode potential between resistor 36 and ground in the form of diode 38, diodes 42 and 44 and the base to emitter junction of transistor 46 are all reverse biased and therefore nonconductive. The voltage on the collector of transistor 46 therefore rises as determined by the resistor divider of resistors 48 and 50 and resistors 48 and 50 supply a bias current from the voltage supply B+ to render diode 54 continuously conductive so that at least a portion of the RF input signal to RF amplifier 14 is shunted by diode 54 to ground. This attenuates strong local RF signals to a level which is more compatible with that of radio receiver 10.

The above described operation of the extended AGC circuit can be more completely understood from the table below in which the audio output of the radio receiver 10, with and without the extended AGC circuit of the present invention, is shown for various RF input levels. As expected in view of the above description, it can be seen that at 950 millivolts of RF input signal level that the audio level with the extended AGC circuit of the present invention is at 2.5 dB whereas without the extended AGC of the present invention, the audio level is at 11.2 dB. More importantly, at the high RF signal level conditions, the audio output level without the extended AGC circuit of the present invention is rapidly rising in comparison with the changes between audio levels when the extended AGC circuit of the present invention is employed.

TABLE

| RF Signal at Line 56 | Audio Level without Extended AGC (Switch 40 in Distant Mode) | Audio Level with Extended AGC (Switch 40 in Distant Mode) | Audio Level During Local Mode of L/D Switch 40 |
|---|---|---|---|
| 0.3 uV | −13.0 dB | −13.0 dB | −33.5 dB |
| 0.95 | −6.5 | −6.7 | −23.5 |
| 3.0 | −3.7 | −3.6 | −10.0 |
| 9.5 | −2.2 | −2.1 | −5.3 |
| 30 | −1.5 | −1.4 | −2.8 |
| 95 | −1.0 | −0.9 | −1.8 |
| 300 | −0.5 | −0.4 | −1.2 |
| 950 | 0 | 0 | −0.6 |
| 3 mV | 0.4 | 0.4 | −0.2 |
| 9.5 | 0.8 | 0.8 | 0.2 |
| 30 | 1.2 | 1.4 | 0.6 |
| 95 | 1.6 | 1.4 | 1.0 |
| 300 | 5.2 | 2.0 | 1.8 |
| 950 | 11.2 | 2.5 | 2.2 |

While an embodiment of the invention has been shown and described, it will be obvious to those skilled in the art that changes and modifications may be made without departing from the invention in its broader aspects and, therefore, the aim of the appended claims is to cover all such changes and modifications as fall within the true spirit and scope of the invention.

We claim:

1. An extended automatic gain control circuit for a tunable radio receiver, said radio receiver including means for coupling RF signals from an antenna to an RF input portion of said receiver, said receiver providing an automatic gain control signal on an AGC line which is related in magnitude to the magnitude of the RF signal to which the radio receiver is tuned, said extended automatic gain control circuit comprising:
    at least one semiconductor means connected to said coupling means, said semiconductor means adapted to limit any RF signals which exceed a predetermined level; and
    extended AGC circuit means responsive to the AGC signal on said AGC line to render said least one semiconductor means continuously conductive to shunt at least a portion of said RF signal away from said radio receiver when said AGC signal is indicative of a high RF signal level to provide an extended, effective AGC range for said radio receiver;
    said extended AGC circuit means further including local/distant switch means having a local mode and a distant mode, said local/distant switch means causing said extended AGC circuit means to render said at least one semiconductor means continuously conductive to shunt at least a portion of the RF signal away from the radio receiver when said local/distant switch is in the local mode.

2. The extended automatic gain control circuit of claim 1 wherein said at least one semiconductive means comprises a pair of back-to-back diodes.

3. The extended automatic gain control circuit of claim 1 wherein said local/distant switch does not affect the performance of said extended AGC circuit means when said local/distant switch is in the distant mode.

4. The extended automatic gain control circuit of claim 1 wherein said extended AGC circuit means further comprises a buffer circuit portion to provide a buffered AGC signal thereby minimizing the loading on said AGC line, and a biasing circuit portion to provide a bias current to said at least one semiconductive means when the buffered AGC signal is indicative of a high RF input signal level and to shunt the bias current away from the at least one semiconductive means when said buffered AGC signal is indicative of a lower RF input signal level condition.

* * * * *